US007522426B2

(12) United States Patent
Koga et al.

(10) Patent No.: US 7,522,426 B2
(45) Date of Patent: Apr. 21, 2009

(54) STORAGE CONTROLLER (75) Inventors: Tsutomu Koga, Tokyo (JP); Mitsuru Inoue, Hiratsuka (JP)

(73) Assignee: Hitachi, Ltd., Tokyo (JP)

( * ) Notice: Subject to any disclaimer, the term of this patent is extended or adjusted under 35 U.S.C. 154(b) by 382 days.

(21) Appl. No.: 11/291,413

(22) Filed: Nov. 30, 2005

(65) Prior Publication Data

US 2007/0083690 A1 Apr. 12, 2007

(30) Foreign Application Priority Data

Oct. 7, 2005 (JP) ............................. 2005-295536

(51) Int. Cl.
*H01R 12/16* (2006.01)
(52) U.S. Cl. .................. 361/788; 361/796; 361/798
(58) Field of Classification Search ................. 361/788, 361/796–798; 439/65–67; 710/300–305
See application file for complete search history.

(56) References Cited

U.S. PATENT DOCUMENTS 5,603,044 A * 2/1997 Annapareddy et al. ...... 710/301

5,991,163 A * 11/1999 Marconi et al. ............. 361/788
6,597,581 B2    7/2003 Barringer et al.
6,966,784 B2 * 11/2005 Van Schuylenbergh et al. .. 439/67

FOREIGN PATENT DOCUMENTS

JP      2003-124655      4/2003

* cited by examiner

Primary Examiner—Tuan T Dinh
(74) Attorney, Agent, or Firm—Townsend and Townsend and Crew LLP

(57) ABSTRACT

A backplane has signal connectors for connecting signals of logical boards connected to an upper level of the backplane; signal connectors for connecting signals of logical boards connected to a lower level of the backplane; power source connectors for supplying power to the logical boards connected to the upper level of the backplane; and power source connectors for supplying power to the logical boards connected to the lower level of the backplane. Some power source connectors are formed at one end of the backplane and the other power source connectors are formed at the other end of the backplane.

5 Claims, 10 Drawing Sheets

STORAGE CONTROLLER

CROSS-REFERENCES TO RELATED APPLICATIONS

This application relates to and claims priority from Japanese Patent Application No. 2005-295536, filed on Oct. 7, 2005, the entire disclosure of which is incorporated herein by reference.

BACKGROUND OF THE INVENTION

The present invention relates to a storage controller for controlling a disk array system. Particularly, it relates to a connection structure for a logical board and a backplane.

A plurality of logical boards is mounted in a disk array system where a plurality of disk drives forms a Redundant Arrays of Independent Inexpensive Disks (RAID) structure. The logical boards have channel adapters for controlling front interfaces connected to host systems, and disk adapters for controlling back interfaces connected to disk drives. A channel adapter may be equipped with a Network Attached Storage (NAS) processor for providing a file share service based on file transfer protocols such as Network File System (NFS) and Common Interface File System (CIFS). The disk array system also has a backplane for relaying signals transmitted between the logical boards. Bus wires for connecting the logical boards to each other and power lines for supplying power to the logical boards are formed on the backplane. Because the signal transmission performance of the backplane influences the performance of the disk array system, the connection structure of the logical boards and the backplane needs to provide high performance, high reliability and fault tolerance. Japanese Patent Laid-Open (Kokai) Publication No. 2003-124655 is known as a document that mentions circuit boards where electronic circuit components are mounted in compact spaces.

SUMMARY OF THE INVENTION

Developments have been made in the technology for mounting as many logical boards as possible in a disk array system so that the disk array system can provide high performance and multifunctionality. In order to mount many various kinds of logical boards in a disk array system, the logical boards are preferably small in size. Small logical boards enable flexible system design and enhance fault tolerance. For example, a logical board may be designed to be half the conventional size so that logical boards can be mounted on the backplane in two levels (upper and lower).

In a conventional power supply method, power is supplied to logical boards by connecting power source connectors at the ends of a backplane and power source connecters at the ends of the logical boards. If the conventional method is used in the aforementioned case where the half-size logical boards are mounted on the backplane in two levels, power source lines have to be formed at the center of the backplane. When the power source lines are formed at the center of the backplane, signal lines of the logical boards mounted on the upper level and signal lines of the logical boards mounted on the lower level on the backplane cannot be connected to each other crossing the power source lines. In order to connect the signal lines of the logical boards on both levels, a new signal layer has to be provided, which increases the manufacturing cost.

The present invention has been devised in the light of the above problem and it is an object of the present invention to suggest a storage controller suitable for high-density mounting of logical boards.

In order to achieve the above object, the present invention provides a storage controller that has a plurality of logical boards and a backplane for connecting signal lines between the logical boards and supplying power to the logical boards. The backplane has a first signal connector for connecting signals of the logical boards connected to an upper level of the backplane, a second signal connector for connecting signals of the logical boards connected to a lower level of the backplane, a first power source connector for supplying power to the logical boards connected to the upper level of the backplane, and a second power source connector for supplying power to the logical boards connected to the lower level of the backplane. The first power source connector is formed at one end of the backplane and the second power source connector is formed at the other end of the backplane.

According to the present invention, a storage controller suitable for high-density mounting of logical boards can be provided.

DETAILED DESCRIPTION OF THE INVENTION

A storage controller according to the present invention has a plurality of logical boards and a backplane for connecting the logical board signal lines to each other and supplying power to the logical boards. The backplane has a multilayered structure including a plurality of signal layers. The layer on the top of the signal layers is called the "surface layer". The backplane has: first signal connectors for connecting signals from of the logical boards connected to the upper level of the backplane; second signal connectors for connecting signals from the logical boards connected to the lower level; first power source connectors for supplying power to the logical boards connected to the upper level; and second power source connectors for supplying power to the logical boards connected to the lower level. The first power source connectors are formed at one end of the backplane (for example, the top end of the backplane) while the second power source connectors are formed at the other end (for example, the bottom end). Because the first and second power source connectors are not formed in the substantial center of the surface layer, signal wires for connecting the first and second signal connectors can be formed on the surface layer. The first and second power source connectors may be formed on the surface layer or may be formed on first and second power source plates, both bridged over the surface layer with a space in between.

Embodiments of the present invention are explained below with reference to the attached drawings. The embodiments do not limit the scope of the claims of the present invention and not all the characteristics explained in the embodiments are necessarily essential for the solving means of the present invention.

EMBODIMENT 1

Figure 1:
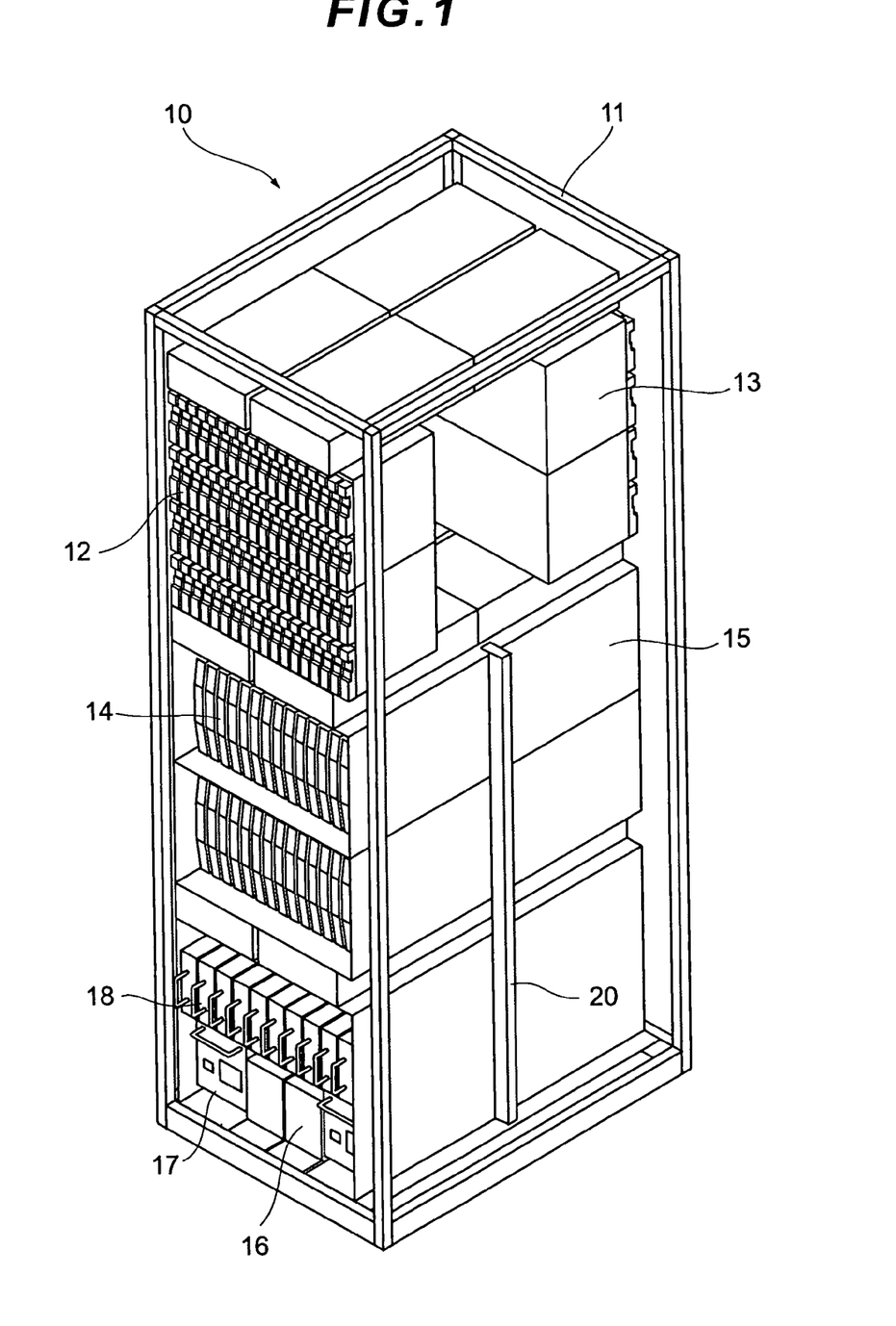
FIG. 1 is a front perspective view of a disk array system according to Embodiment 1.
Figure 2:
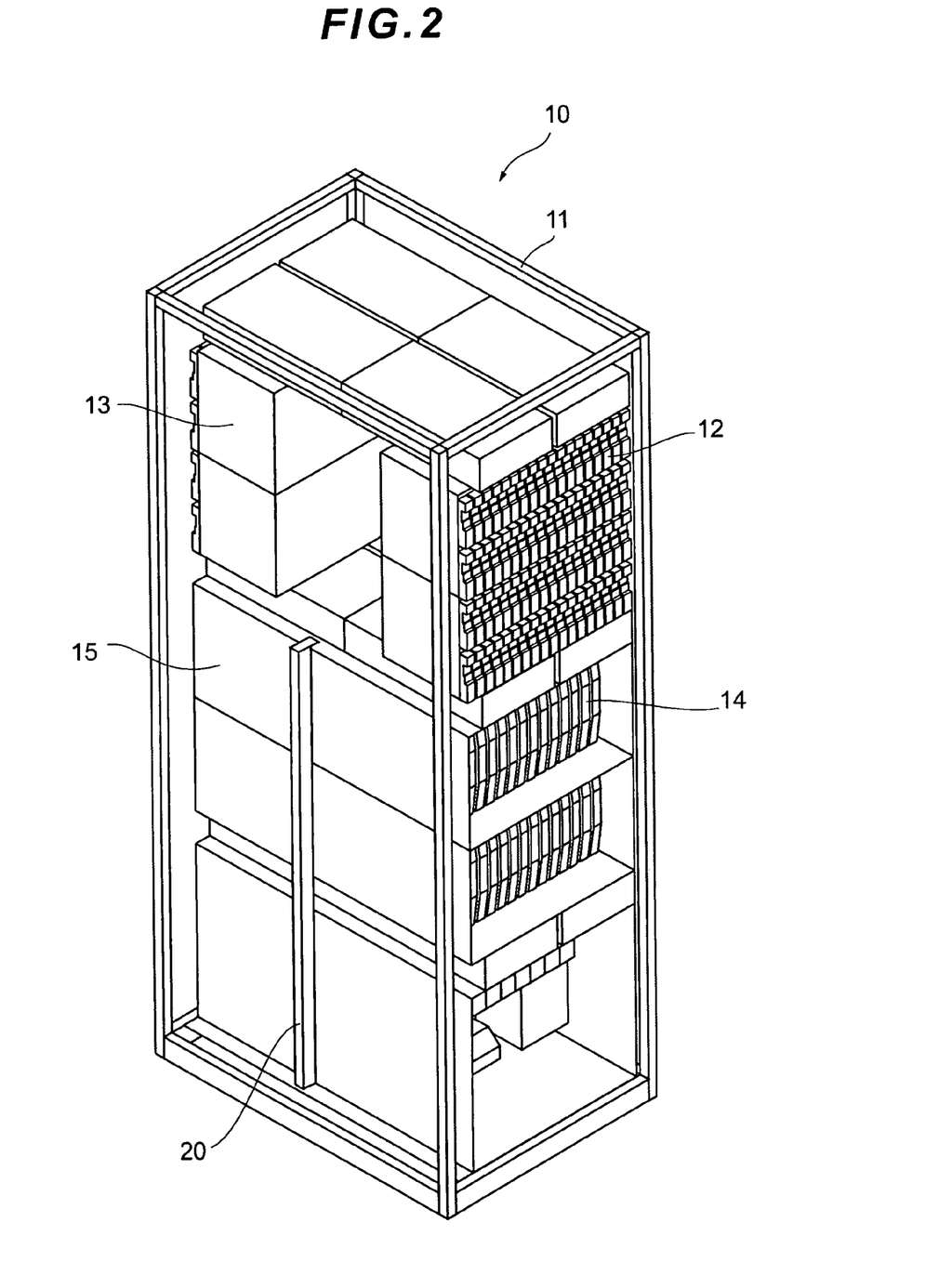
FIG. 2 is a rear perspective view of the disk array system according to Embodiment 1.

FIG. 1 is a front perspective view of a disk array system 10 according to the present invention and FIG. 2 is a rear perspective view of the disk array system 10. As shown in the drawings, the disk array system 10 has a basic frame 11, disk boxes 13, logical board boxes 15, and alternating-current power sources 16.

The basic frame 11 has a rack-shaped frame structure, in which the disk boxes 13, logical board boxes 15, and alternating-current power sources 16 are mounted.

A disk box 13 has a box structure for mounting a plurality of disk drives 12 therein. Examples of the disk drives 12 include Fibre Channel (FC) disk drives, Serial Advanced Technology Attachment (SATA) disk drives, Parallel Advanced Technology Attachment (PATA) disk drives, Fibre Attached Technology Adapted (FATA) disk drives, and Small Computer System Interface (SCSI) disk drives.

A logical board box 15 is for mounting a plurality of logical boards 14. The logical boards 14 are controller boards having electronic circuits (micro processors, memory, input/output devices etc.). The channel adapters or disk adapters are mounted on the logical boards 14. The channel adapters are for controlling front interfaces connected to host systems. Disk adapters are for controlling back interfaces connected to the disk drives 12. Some channel adapters have NAS processors mounted therein. Incidentally, the logical boards 14 may also be called the "logical modules".

Alternating-current power output from the alternating-current power sources 16 is converted into direct current by AC/DC converters 17 and supplied to the logical boards 14. The disk array system 10 also has a battery 18 in case of power failure or blackout in the disk array system 10.

A backplane 20 relays signals transmitted between the logical boards 14 and supplies direct current output from the external power source (the AC/DC converters 17 and the batteries 18) to the logical boards 14. The channel adapters and the disk adapters mounted on the logical boards 14 are connected to each other via an interconnection network such as a crossbar switch, and also connected to shared memory and cache memory. A storage controller controlling the disk array system 10 has a plurality of the logical boards 14 and the backplane 20. The backplane 20 may also be called the "backboard," "connection board," "wiring board," or "relay board."

Figure 3:
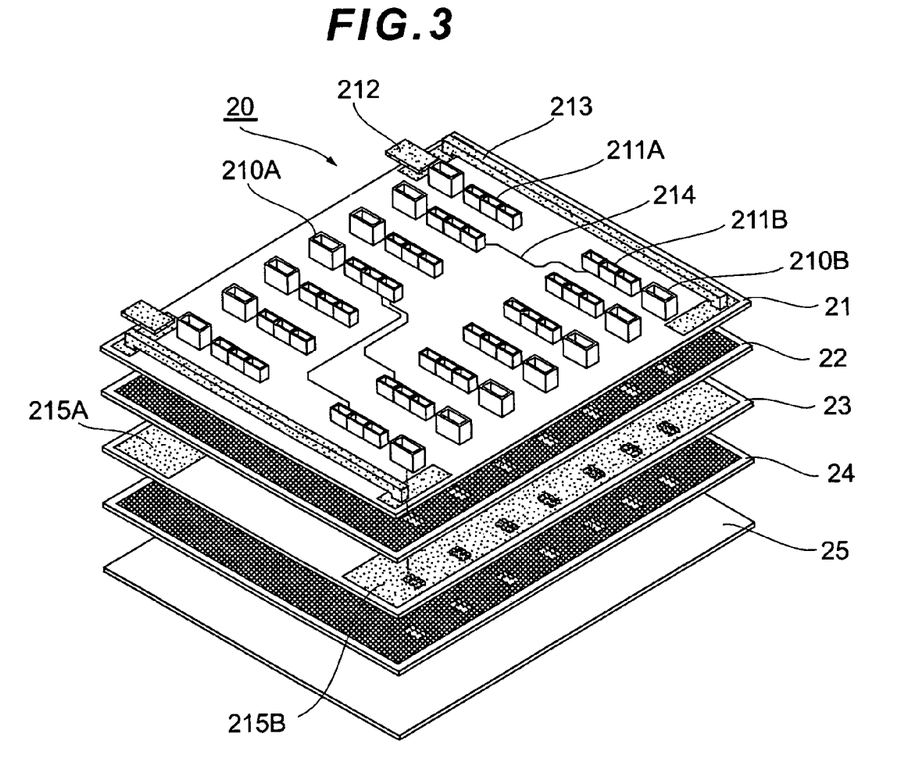
FIG. 3 is an exploded perspective view of a backplane according to Embodiment 1.

FIG. 3 is an exploded perspective view of the backplane 20 according to the present invention. As FIG. 3 shows, the backplane 20 has a structure where the surface layer 21, a gland layer 22, a power source/signal layer 23, another gland layer 24, and a signal layer 25 are laminated. The surface layer 21 is a wiring board having a connection structure for interface-connection with the logical boards 14. It has power source connectors 210A and 210B, signal connectors 211A and 211B, power supply portions 212, bus bars 213, and signal wires 214 formed thereon. The power source/signal layer 23 is a wiring board for supplying power to the logical boards 14 and connecting logical board signal lines to one another. The power source/signal layer 23 has power source lines 215A and 215B formed thereon. The signal layer 25 is a wiring board for connecting signal lines of the logical boards 14 to one another. The gland layer 22 is inserted between the surface layer 21 and the power source/signal layer 23 and the gland layer 24 is inserted between the power source/signal layer 23 and the signal layer 25. The gland layers 22 and 24 are for removing noise signals between the layers. Incidentally, the five-layer structure is indicated as the lamination structure of the backplane 20 in Embodiment 1 for ease of explanation, however, a multilayer structure having six or more layers is also possible.

At the top end of the backplane 20, a plurality of power source connectors 210A is formed for supplying power to the logical boards 14 that are connected to the upper level of the backplane 20. At the bottom end of the backplane 20, a plurality of power source connectors 210B is formed for supplying power to the logical boards 14 that are connected to the lower level of the backplane 20. In other words, the power source connectors 210A and 210B are formed at both ends (alternatively called both sides or both edges) of the backplane 20 in Embodiment 1. Whereas, at the center of the backplane 20, a plurality of signal connectors 211A is formed for connecting signal lines of the logical boards 14 connected to the upper level of the backplane 20; and a plurality of signal connectors 211B is formed for connecting signal lines of the logical boards 14 connected to the lower level of the backplane 20. The direct current power, which the power supply portions 212 receive from the outside (the aforementioned AC/DC converters 17 and the batteries 18) is supplied to the power source connectors 210A and also to the power source connectors 210B via the bus bars 213.

Figure 4:
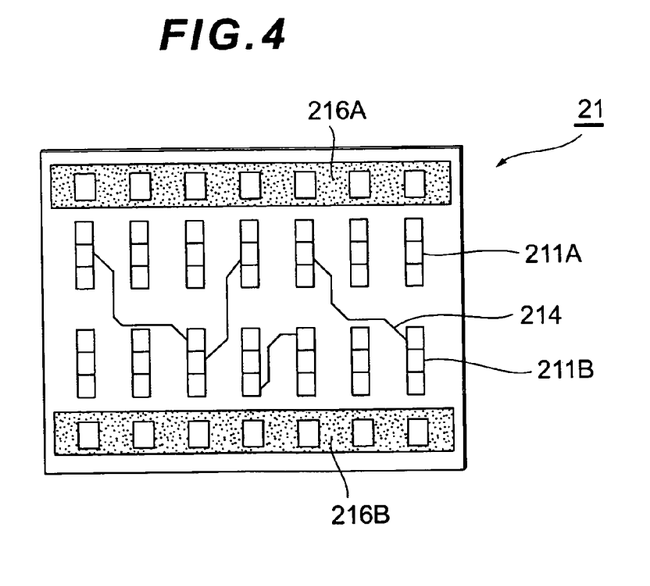
FIG. 4 is a back face of a surface layer according to Embodiment 1.

FIG. 4 shows the back face of the surface layer 21. In FIG. 4, 221A and 211B indicate the signal connectors, 214 indicates a signal wire, and 216A and 216B indicate power source lines. The power source lines 216A and 216B are formed at the back side of the power source connectors 210A and 210B respectively. Because the power source connectors 210A and 210B are formed at both ends of the backplane 20, the signal wires 214 for connecting the signal connectors 211A and 211B formed on the upper and lower levels of the backplane 20 respectively can be formed between the two power source lines 216A and 216B. As mentioned above, if the power source lines are formed between the signal connectors 211A and 211B, the signal wires 214 cannot cross the power source lines, therefore, the signal wires 214 cannot be formed to connect the signal connectors 211A and 211B.

Figure 5:
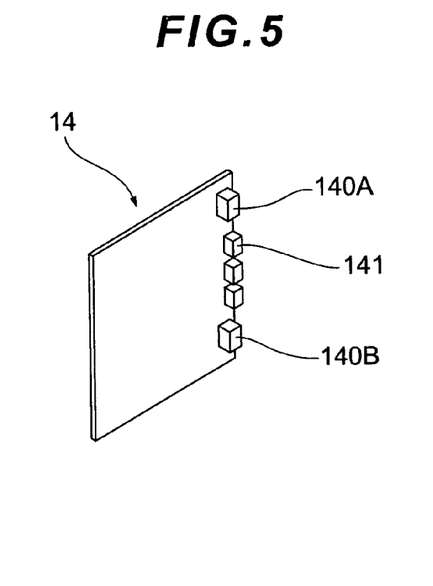
FIG. 5 shows the connector structure of a logical board according to Embodiment 1.
Figure 6:
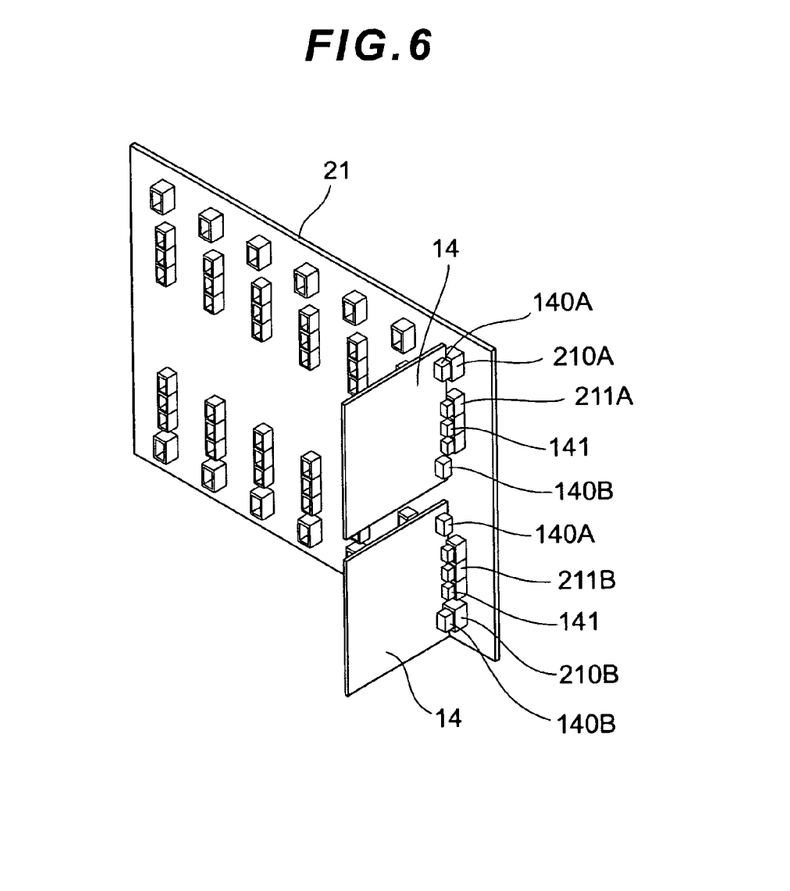
FIG. 6 shows the connection structure of the logical boards and the surface layer according to Embodiment 1.

FIG. 5 shows the connector structure of a logical board 14. FIG. 6 shows the connection structure of the logical boards 14 and the surface layer 21. As shown in FIG. 5, the logical board 14 has power source connectors 140A and 140B and a signal connector 141 formed thereon. The power source connector 140A is formed at the top end of the logical board 14 and the power source connector 140B is formed at the bottom end. The signal connector 141 is formed at the center of the logical board 14. As shown in FIG. 6, a logical board 14 may be connected to the upper level of the surface layer 21 and it may also be connected to the lower level of the surface layer 21.

When a logical board 14 is connected to the upper level of the surface layer 21, the power source connector 210A and the power source connector 140A connect to each other and the signal connector 211A and the signal connector 141 connect to each other. The power source connector 140B functions as a dummy connector. Meanwhile, when a logical board 14 is connected to the lower level of the surface layer 21, the power source connector 210B and the power source connector 140B connect to each other and the signal connector 211B and the signal connector 141 connect to each other. The power source connector 140A functions as a dummy connector.

In order to allow the logical boards 14 to be connected both the upper and lower levels of the backplane 20 as above, the connection structure has to be such that power is supplied to the logical boards 14 in both cases where the power source connector 140A of the logical board 14 is connected to the power source connector 210A of the backplane 20 and where the power source connector 140B of the logical board 14 is connected to the power source connector 210B of the backplane 20. An inner layer method and a bus bar method are means to supply power to the logical boards 14 regardless of the mount positions thereof.

Figure 7:
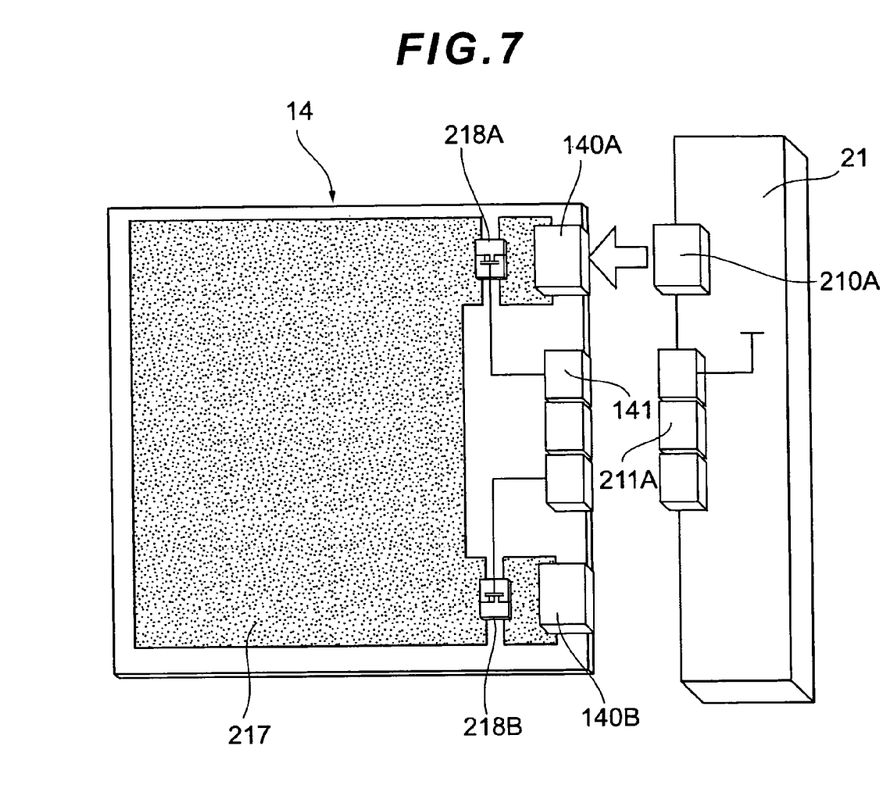
FIG. 7 shows a structure for supplying power to the logical board by an internal layer method.

FIG. 7 shows the structure where power is supplied to the logical board 14 by the inner layer method. On the logical board 14, a transistor 218A is formed between the power source layer 217 and the power source connector 140A for switching on/off the power supply to the power source layer 217, and a transistor 218B is formed between the power source layer 217 and the power source connector 140B for switching on/off the power supply to the power source layer 217. When a logical board 14 is connected to the upper level of the backplane 20, the transistor 218A is turned on according to a switching control signal supplied from the signal connector 211A and so the power is supplied from the power source connector 210A to the power source connector 140A. At this point in time, the switching control signal is not supplied to the transistor 218B, which therefore remains switched off. Whereas, although not shown in the drawing, when a logical board 14 is connected to the lower level of the backplane 20, the transistor 218B is turned on according to a switching control signal supplied from the signal connector 211A and so the power is supplied from the power source connector 210B to the power source connector 140B. At this point in time, the switching control signal is not supplied to the transistor 218A therefore it remains switched off. Incidentally, arbitrary switching elements may be used instead of the transistors 218A and 218B.

Figure 8:
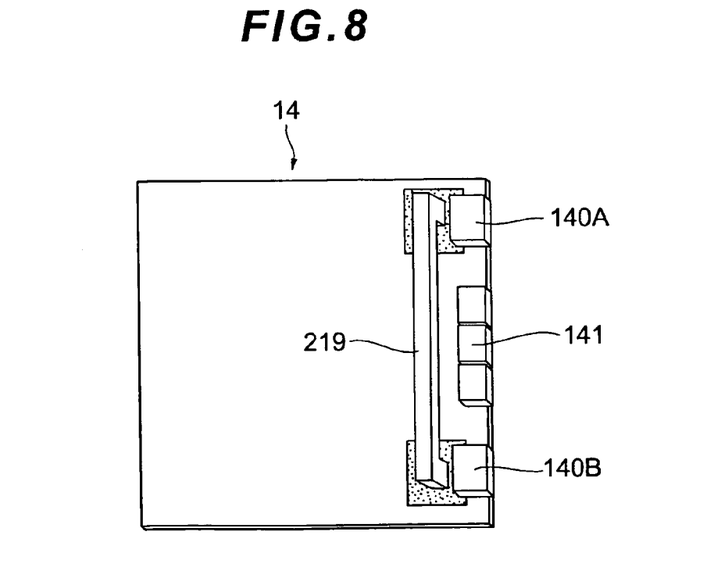
FIG. 8 shows a structure for supplying power to the logical board by a bus bar method.

FIG. 8 shows the structure where power is supplied to the logical Board 14 by the bus bar method. A bus bar 219 is formed between the power source connector 140A and 140B for transmitting power therebetween. It is preferable that the bus bar 219 be of a compact size appropriate for high-density mounting and formed a certain distance away from the signal wires 214 so that it does not give noise to the signal wires 214. The surface of the bus bar 219 is preferably coated with an insulating material. A transistor may be formed between the bus bar 219 and the power source connectors 140A and 140B so that the power supply to the bus bar 219 is controlled by turning on/off the transistor according to the mount position of the logical board 14.

According to Embodiment 1, the logical boards 14 can be mounted at both the upper and lower levels of the backplane 20, enabling the mounting of various kinds of many logical boards 14 in the disk array system 10. Accordingly, the functions of the disk array system 10 can be enhanced and the multifunctionality is realized in the system 10. Moreover, because the power source connectors 210A and 210B are formed at the both ends of the backplane 20, the signal wires 214 connecting the signal connectors 211A and 211B can be formed on the surface layer 21, which is also appropriate for the high-density mounting of the logical boards 14. Furthermore, because the logical boards 14 connected to the upper and lower levels of the backplane 20 face the same direction, the alignments of port numbers of the logical boards 14 do not vary according to the mount positions of the logical boards 14 on the backplane 20, which is convenient for the maintenance and management of the logical boards 14.

EMBODIMENT 2

Figure 9:
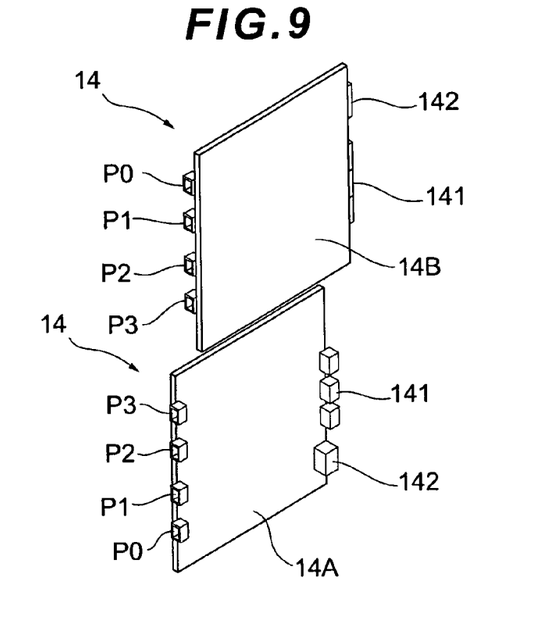
FIG. 9 shows the connector structure of logical boards according to Embodiment 2.
Figure 10:
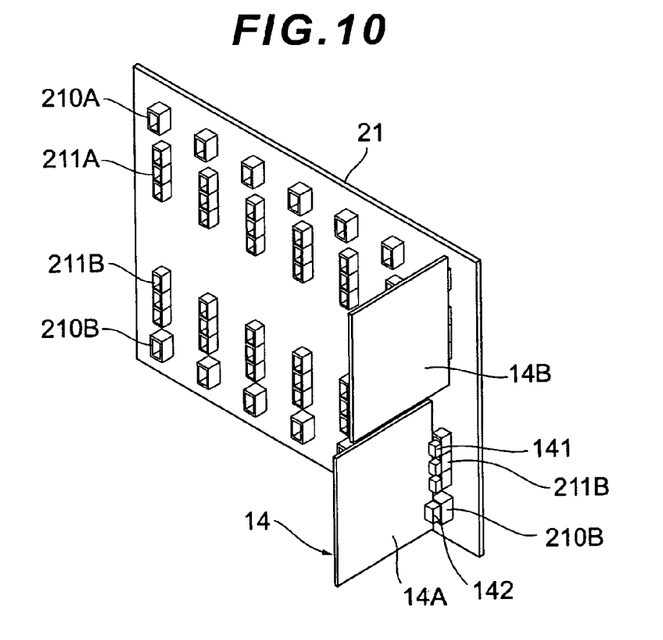
FIG. 10 shows the connection structure of the logical boards and a surface layer according to Embodiment 2.

Embodiment 2 is explained with reference to FIG. 9 to FIG. 12. FIG. 9 shows another connector structure for the logical board 14. FIG. 10 shows the connection structure of the logical boards 14 and the surface layer 21. As shown in the drawings, the signal connector 141 and the power source connector 142 are formed on the backplane connection side of the logical board 14 and ports P0 to P3 are formed on the host interface connection side. The power source connector 142 is formed on one end of the backplane connection side. The ports P0 to P3 connect with the host interfaces. 14A indicates a front face of the logical board 14 and 14B indicates a back face of the logical board 14. When the logical board 14 is mounted on the upper level of the surface layer 21, the power source connector 142 is connected to the power source connector 210A and the signal connector 141 is connected to the signal connector 211A. Meanwhile, when the logical board 14 is mounted on the lower level of the surface layer 21, the power source connector 142 is connected to the power source connector 210B and the signal connector 141 is connected to the signal connector 211B.

Embodiment 2 is different from Embodiment 1 in that the power source connector 142 is formed only on one end of the logical board 14. Accordingly, in Embodiment 1, the logical boards 14 mounted on the upper and lower levels of the surface layer 21 face the same direction, however in Embodiment 2, the logical boards 14 mounted on the upper and lower levels of the surface layer 21 do not face the same direction and the logical boards 14 on the lower level are mounted upside down. Therefore, the alignment of the ports P0 to P3 of the logical board 14 on the lower level of the surface layer 21 is the inverse of the alignment of the ports P0 to P3 of the logical board 14 on the upper level.

Figure 11A:
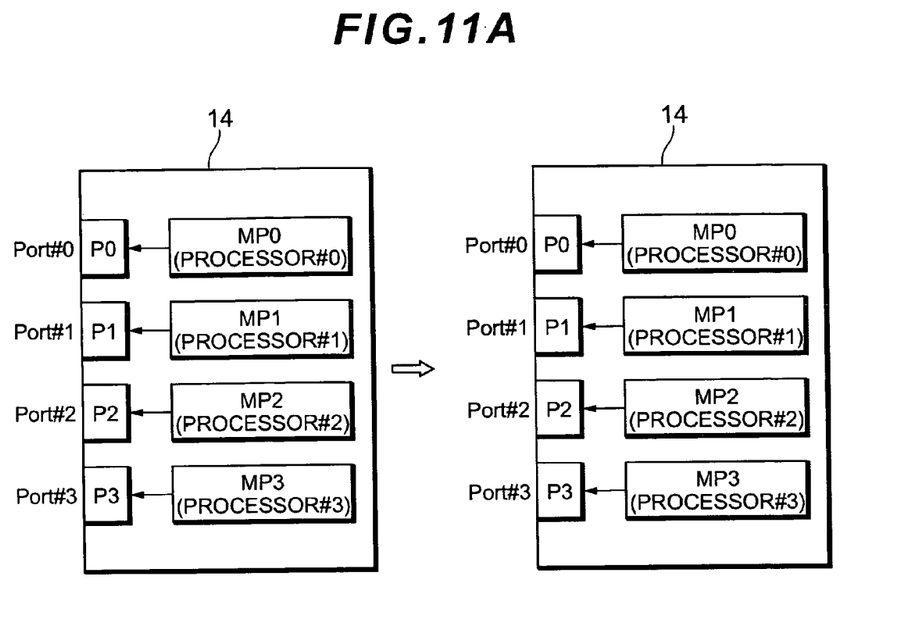
FIG. 11A-11B are conceptual diagrams illustrating processing to change port numbers according to mount position.
Figure 11B:
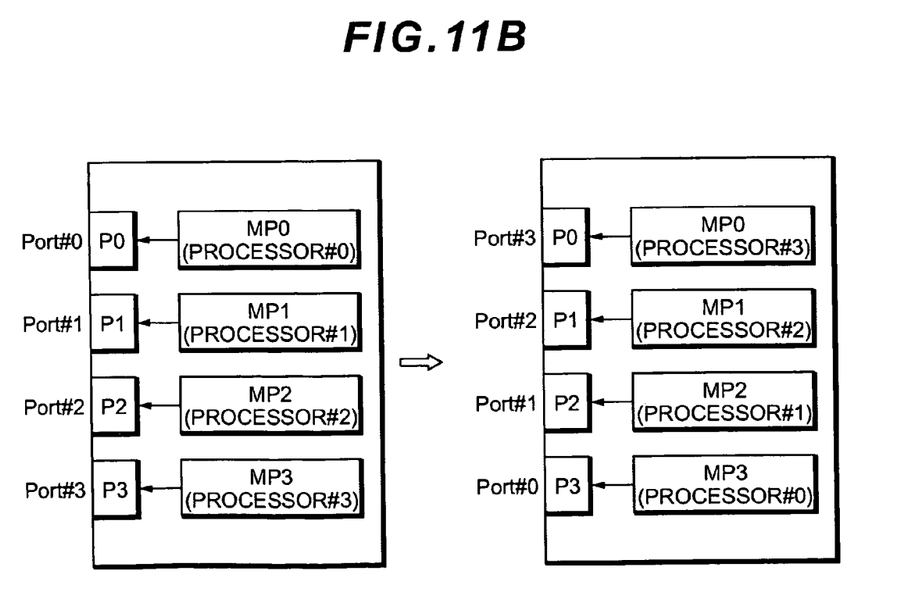

FIG. 11A-11B are conceptual diagrams showing processing to change port numbers in accordance with the mount position of a logical board 14. In FIG. 11A-11B, MP0 to MP3 indicate micro processors provided in a logical board 14 and are connected to the respective ports P0 to P3, one to one. The micro processors MP0 to MP3 are assigned logical processor numbers PROCESSOR#0 to PROCESSOR#3 and the ports P0 to P3 are assigned logical port numbers PORT#0 to PORT#3. As shown in FIG. 11A, when a logical board 14 is mounted on the upper level of the surface layer 21, its processor numbers PROCESSOR#0 to PROCESSOR#3 and its port numbers PORT#0 to PORT#3 remain unchanged. On the other hand, as shown in FIG. 11B, when a logical board 14 is mounted on the lower level of the surface layer 21, its processor numbers PROCESSOR#0 to PROCESSOR#3 and its ports numbers PORT#0 to PORT#3 are changed in such a manner that the alignment of the processor numbers PROCESSOR#0 to PROCESSOR#3 is the inverse of the alignment of the port numbers PORT#0 to PORT#3. Incidentally, the processor numbers and the port numbers correspond to each other, one to one even after the change of the numbers.

Figure 12:
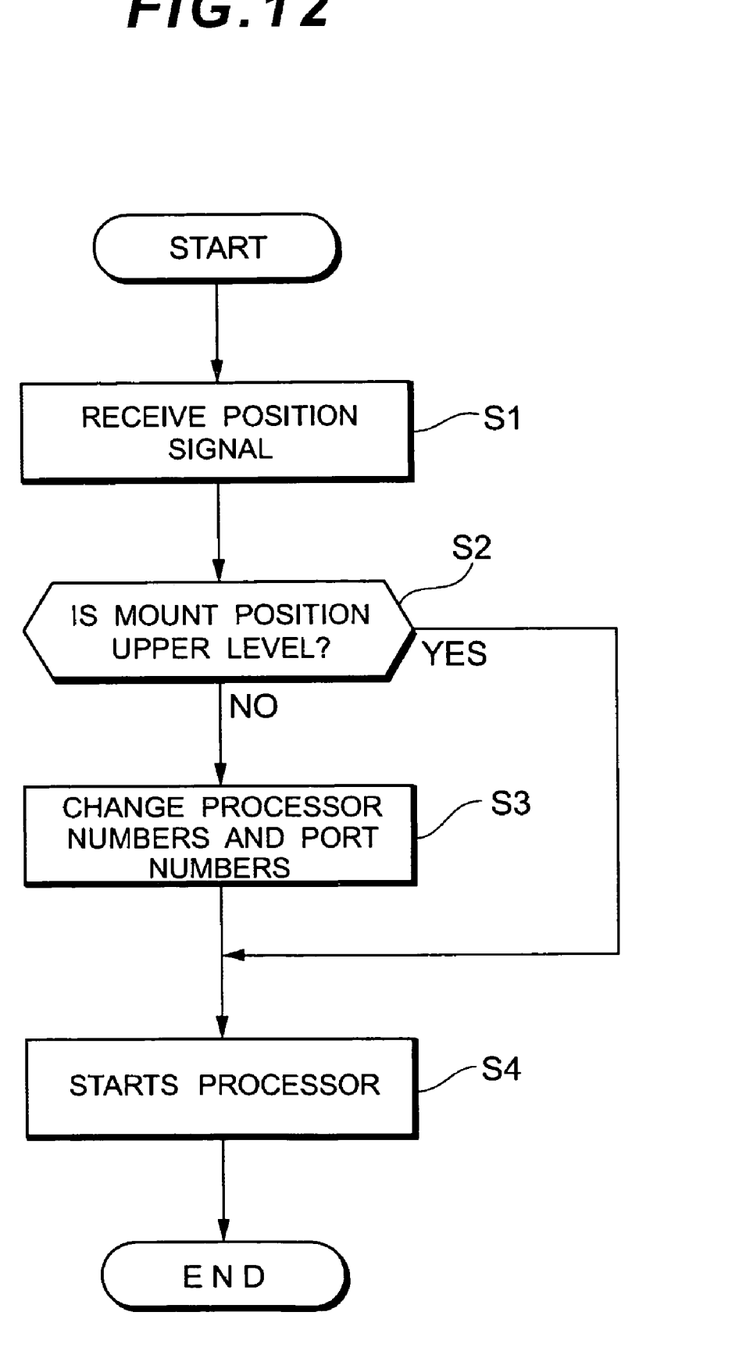
FIG. 12 is a flow chart for processing to change port numbers according to mount position.

FIG. 12 shows the flow of processing to change the port numbers according to the mount position of a logical board 14. When the logical board 14 is mounted on the surface layer 21, it receives a position signal from the signal connector 211A or 211B (S1). If it is set so that, for example, a high level position signal is output from the signal connector 211A and a low level position signal is output from the signal connector 211B, the logical board 14 can judge whether it is mounted on the upper level or the lower level of the surface layer 21 by judging the signal level of the position signal input to the signal connector 141 upon mounting.

The logical board 14 judges whether the mount position is the upper level (S2). If it judges that the mount position is the lower level (S2; No), it changes the processor numbers PROCESSOR#0 to PROCESSOR#3 and the port numbers PORT#0 to PORT#3 as mentioned above (S3), and starts the micro processors MP0 to MP3 (S4). Whereas, if the logical board 14 judges that the mount position is the upper level (S2; Yes), it skips the processing steps to change the processor numbers PROCESSOR#0 to PROCESSOR#3 and the port numbers PORT#0 to PORT#3 and starts the micro processors MP0 to MP3 (S4).

According to Embodiment 2, even when a logical board 14 is mounted upside down, depending on the mount position, inconvenience due to the inversion can be solved by changing the processor numbers PROCESSOR#0 to PROCESSOR#3 and the port numbers PORT#0 to PORT#3.

EMBODIMENT 3

Figure 13:
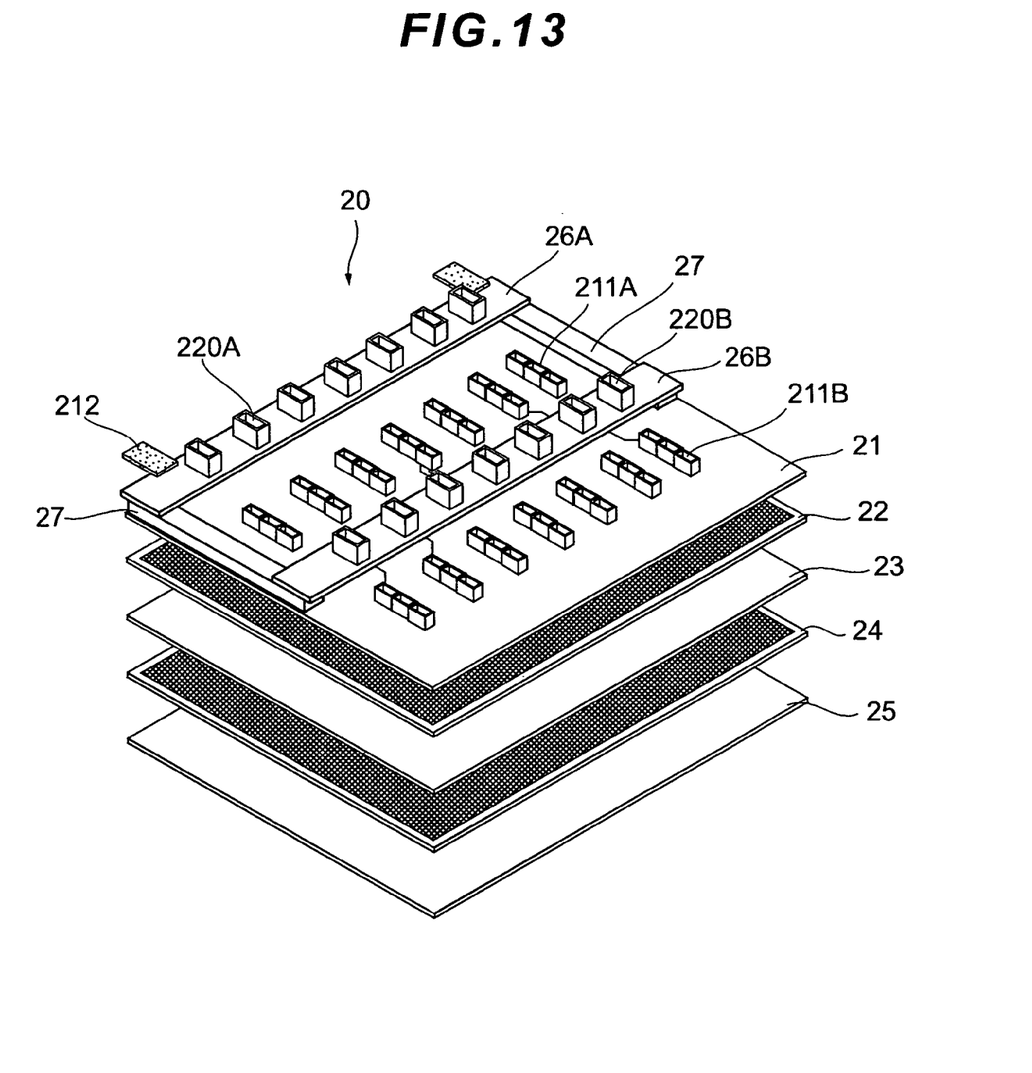
FIG. 13 is an exploded perspective view of a backplane according to Embodiment 3.

Embodiment 3 is explained with reference to FIG. 13 and FIG. 14. Components having the same reference numbers as in FIG. 3 indicate the same components, therefore detailed explanations thereof are omitted. As shown in FIG. 13, power source plates 26A and 26B are formed over the surface layer 21 via supporting elements 27. The power source plate 26A has a plurality of power source connectors 220A and is formed at the top end side of the backplane 20. The power source plate 26B has a plurality of power source connectors 220B and is formed crossing substantially the center of the backplane 20. Both the power source plates 26A and 26B are bridged over and are a certain distance (distance corresponding to the thickness of the supporting elements 27) away from the surface layer 21. The power source plates 26A and 26B are conductive plates for supplying power to the power source connectors 220A and 220B. The supporting elements 27 are made of a conductive material and function as bus bars for delivering power, which the power supply portions 212 receive from outside, from the power source plate 26A to the power source plate 26B.

Figure 14:
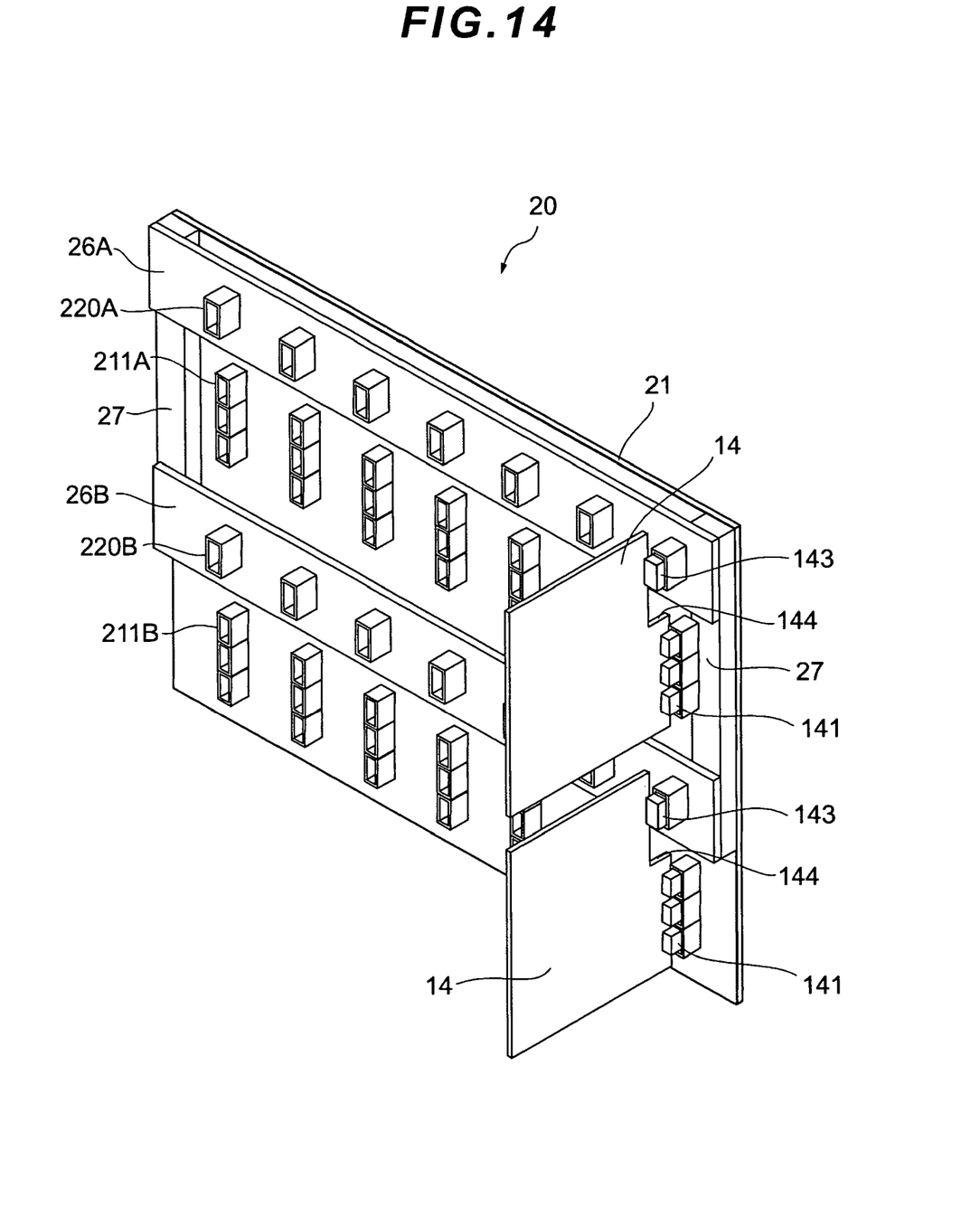
FIG. 14 shows the connection structure of logical boards and a surface layer according to Embodiment 3.

As shown in FIG. 14, the signal connector 141 and the power source connector 143 are formed on the logical board 14. The power source connector 143 is formed at a cutout portion 144 of the logical board 14. When the logical board 14 is mounted on the upper level of the surface layer 21, the power source connector 143 is connected to the power source connector 220A and the signal connector 141 is connected to the signal connector 211A. Meanwhile, when the logical board 14 is mounted on the lower level of the surface layer 21, the power source connector 143 is connected to the power source connector 220B and the signal connector 141 is connected to the signal connector 211B.

According to Embodiment 3, the power source plates 26A and 26B, having the power source connectors 220A and 220B bridged over the surface layer 21, and the signal wires for connecting the signal connectors 211A and 211B can be formed.

We claim:

1. A storage controller comprising a plurality of logical boards and a backplane for connecting signal lines between the logical boards and supplying power to the logical boards,
    wherein the backplane comprises a first signal connector for connecting signals of the logical boards connected to an upper level of the backplane, a second signal connector for connecting signals of the logical boards connected to a lower level of the backplane, a first power source connector for supplying power to the logical boards connected to the upper level of the backplane, and a second power source connector for supplying power to the logical boards connected to the lower level of the backplane,
    wherein the first power source connector is formed at one end of the backplane and the second power source connector is formed at the other end of the backplane,
    wherein each of the logical boards has a third power source connector disposed at one end thereof and a fourth power source connector disposed at the other end thereof,
    wherein one of the logical boards is disposed at the upper level of the backplane and is supplied with power by way of a connection between the third power source connector of said one of the logical boards and the first power source connector,
    wherein another one of the logical boards is disposed at the lower level of the backplane and is supplied with power by way of a connection between the fourth power source connector of said another one of the logical boards and the second power source connector,
    wherein the logical board further comprises a plurality of ports to be connected to host interfaces, the logical board receives from the backplane a position signal indicating whether the logical board is connected to the upper level of the backplane or the lower level of the backplane, and logical port numbers of the ports are changed in such a manner that the alignment of the logical port numbers of the ports of the logical boards connected to the upper level of the backplane and the alignment of the logical port numbers of the ports of the logical boards connected to the lower level of the backplane match.

2. The storage controller according to claim 1, wherein the first power source connector and the second power source connector are formed on a surface layer of the backplane.

3. The storage controller according to claim 1, wherein the logical board comprises a power source layer for supplying power to an electronic circuit mounted on the logical board, a first switching element for establishing or cutting electric connections between the third power source connector and the power source layer, and a second switching element for establishing and cutting electric connections between the fourth power source connector and the power source layer, and when the logical board is connected to the upper level of the backplane, the first switching element establishes electric connections between the third power source connector and the power source layer while the second switching element cuts the electric connections between the fourth power source connector and the power source layer, whereas, when the logical board is connected to the lower level of the backplane, the first switching element cuts the electric connections between the third power source connector and the power source layer while the second switching element establishes electric connections between the fourth power source connector and the power source layer.

4. The storage controller according to claim 1, further comprising a first power source plate and a second power source plate both bridged over and away from a surface layer of the backplane, wherein the first power source connector is formed on the first power source plate and the second power source connector is formed on the second power source plate.

5. A storage controller comprising a plurality of logical boards and a backplane for connecting signal lines between the logical boards and supplying power to the logical boards, wherein the backplane comprises a first signal connector for connecting signals of the logical boards connected to an upper level of the backplane, a second signal connector for connecting signals of the logical boards connected to a lower level of the backplane, a first power source connector for supplying power to the logical boards connected to the upper level of the backplane, and a second power source connector for supplying power to the logical boards connected to the lower level of the backplane, wherein the first power source connector is formed at one end of the backplane and the second power source connector is formed at the other end of the backplane, wherein the first power source connector and the second power source connector are formed on a surface layer of the backplane, wherein the logical board comprises a third power source connector connectable to either the first power source connector or the second power source connector and a third signal connector connectable to either the first signal connector or the second signal connector, and when the logical board is connected to the upper level of the backplane, the logical board receives power supplied from the third power source connector connected to the first power source connector, whereas when the logical board is connected to the lower level of the backplane, the logical board receives power supplied from the third power source connector connected to the second power source connector, wherein the logical board further comprises a plurality of ports to be connected to host interfaces, the logical board receives from the backplane a position signal indicating whether the logical board is connected to the upper level of the backplane or the lower level of the backplane, and logical port numbers of the ports are changed in such a manner that the alignment of the logical port numbers of the ports of the logical boards connected to the upper level of the backplane and the alignment of the logical port numbers of the ports of the logical boards connected to the lower level of the backplane match.

* * * * *